US011286577B2

(12) United States Patent
Koizumi et al.

(10) Patent No.: US 11,286,577 B2
(45) Date of Patent: Mar. 29, 2022

(54) PLATING METHOD AND PLATING APPARATUS

(71) Applicant: EBARA CORPORATION, Tokyo (JP)

(72) Inventors: Ryuya Koizumi, Tokyo (JP); Masashi Shimoyama, Tokyo (JP); Mizuki Nagai, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 37 days.

(21) Appl. No.: 16/842,423

(22) Filed: Apr. 7, 2020

(65) Prior Publication Data

US 2020/0232115 A1    Jul. 23, 2020

Related U.S. Application Data

(62) Division of application No. 15/915,939, filed on Mar. 8, 2018, now Pat. No. 10,648,099.

(30) Foreign Application Priority Data

Mar. 14, 2017  (JP) ................. JP2017-49044

(51) Int. Cl.
| | | |
|---|---|---|
| *C25D 21/12* | (2006.01) | |
| *C25D 17/02* | (2006.01) | |
| *C25D 17/00* | (2006.01) | |
| *H01L 21/67* | (2006.01) | |
| *C25D 21/14* | (2006.01) | |
| *C25D 17/06* | (2006.01) | |
| *C25D 3/38* | (2006.01) | |

(52) U.S. Cl.
CPC ........... *C25D 21/14* (2013.01); *C25D 17/001* (2013.01); *C25D 17/02* (2013.01); *C25D 17/06* (2013.01); *C25D 21/12* (2013.01); *H01L 21/6723* (2013.01); *H01L 21/67173* (2013.01); *C25D 3/38* (2013.01)

(58) Field of Classification Search
CPC ...................................................... C25D 17/001
See application file for complete search history.

(56) References Cited

U.S. PATENT DOCUMENTS

| | | |
|---|---|---|
| 2005/0010321 A1 | 1/2005 | Contos et al. |
| 2005/0016201 A1 | 1/2005 | Ivanov et al. |
| 2005/0072358 A1 | 4/2005 | Katsuoka et al. |
| 2016/0130702 A1 | 5/2016 | Nakagawa et al. |

FOREIGN PATENT DOCUMENTS

| | | |
|---|---|---|
| CN | 1809656 A | 7/2006 |
| CN | 100497731 C | 6/2009 |
| JP | H03-240977 A | 10/1991 |

(Continued)

*Primary Examiner* — Brian W Cohen
(74) *Attorney, Agent, or Firm* — BakerHostetler

(57) ABSTRACT

A plating method capable of saving a substrate in an event of a failure of a transporter, a plating tank, or other component when the substrate is being plated is disclosed. The plating method includes: transporting a plurality of substrates to a plurality of plating tanks, respectively, with a transporter; immersing the plurality of substrates in a plating solution held in the plurality of plating tanks to plate the plurality of substrates; detecting a failure that has occurred in the transporter or a post-processing tank; and replacing the plating solution in the plurality of plating tanks with a preservative liquid to thereby immerse the plurality of substrates in the preservative liquid.

6 Claims, 10 Drawing Sheets

(56) References Cited

FOREIGN PATENT DOCUMENTS

| | | | |
|---|---|---|---|
| JP | 2007-314880 | A | 12/2007 |
| JP | 2011-146448 | A | 7/2011 |
| JP | 2016-089253 | A | 5/2016 |
| TW | 200943401 | A | 10/2009 |
| WO | WO 2005/010954 | A1 | 2/2005 |

FIG. 8

STEP 1: CIRCULATE PLATING SOLUTION BETWEEN PLATING TANK AND PLATING SOLUTION RESERVOIR

| V1 | V2 | V3 | V4 | V5 | V7 |
|---|---|---|---|---|---|
| OPEN/CLOSED | OPEN | CLOSED | CLOSED | CLOSED | CLOSED |

STEP 2: DELIVER PLATING SOLUTION IN PLATING CELL AND OVERFLOW TANK TO PLATING SOLUTION RESERVOIR

| V1 | V2 | V3 | V4 | V5 | V7 |
|---|---|---|---|---|---|
| CLOSED | OPEN | CLOSED | OPEN | CLOSED | CLOSED |

LOW LEVEL REACHED? NO → (loop back)
YES ↓

STEP 3: RINSE SUBSTRATE IN PLATING CELL

| V1 | V2 | V3 | V4 | V5 | V7 |
|---|---|---|---|---|---|
| CLOSED | CLOSED | CLOSED | CLOSED | OPEN/CLOSED | OPEN/CLOSED |

STEP 4: KEEP PLATING CELL FILLED WITH RINSING LIQUID

| V1 | V2 | V3 | V4 | V5 | V7 |
|---|---|---|---|---|---|
| CLOSED | CLOSED | CLOSED | CLOSED | CLOSED | CLOSED |

FIG. 9

STEP 1: DRAIN PRESERVATIVE LIQUID FROM PLATING CELL AND OVERFLOW TANK

| V1 | V2 | V3 | V4 | V5 | V6 |
|---|---|---|---|---|---|
| CLOSED | CLOSED | CLOSED | CLOSED | OPEN | CLOSED |

LOW LEVEL REACHED? NO (loop) / YES ↓

STEP 2: STOP DRAINING PRESERVATIVE LIQUID

| V1 | V2 | V3 | V4 | V5 | V6 |
|---|---|---|---|---|---|
| CLOSED | CLOSED | CLOSED | CLOSED | CLOSED | CLOSED |

STEP 3: SUPPLY FLUSHING LIQUID TO PLATING CELL

| V1 | V2 | V3 | V4 | V5 | V6 |
|---|---|---|---|---|---|
| CLOSED | CLOSED | CLOSED | CLOSED | OPEN/CLOSED | OPEN/CLOSED |

STEP 4: START SUPPLYING PLATING SOLUTION FROM PLATING SOLUTION RESERVOIR TO PLATING CELL

| V1 | V2 | V3 | V4 | V5 | V6 |
|---|---|---|---|---|---|
| OPEN | OPEN | CLOSED | CLOSED | CLOSED | CLOSED |

HIGH LEVEL REACHED? NO (loop) / YES ↓

STEP 5: START CIRCULATING PLATING SOLUTION BETWEEN PLATING TANK AND PLATING SOLUTION RESERVOIR

| V1 | V2 | V3 | V4 | V5 | V6 |
|---|---|---|---|---|---|
| OPEN | OPEN | CLOSED | CLOSED | CLOSED | CLOSED |

STEP 6: ADJUST FLOW RATE OF CIRCULATING PLATING SOLUTION; ADJUST COMPONENTS OF PLATING SOLUTION

| V1 | V2 | V3 | V4 | V5 | V6 |
|---|---|---|---|---|---|
| OPEN | OPEN | CLOSED | CLOSED | CLOSED | CLOSED |

PLATING METHOD AND PLATING APPARATUS

CROSS REFERENCE TO RELATED APPLICATION

This document claims priority to Japanese Patent Application Number 2017-49044 filed Mar. 14, 2017, the entire contents of which are hereby incorporated by reference.

BACKGROUND

A plating apparatus generally includes various types of processing tanks, such as a plating tank for plating a substrate therein, a pre-cleaning tank for cleaning a substrate therein before a substrate is plated, a rinsing tank for rinsing a plated substrate therein, and a blowing tank for drying a rinsed substrate therein. A substrate, which is held by a substrate holder, is transported to each of the processing tanks by a transporter. More specifically, the substrate holder is placed in each of the processing tanks by the transporter, and the substrate is processed in each of the processing tanks while the substrate is held by the substrate holder.

In the plating tank, the substrate is immersed in a plating solution for a preset period of time. The substrate holder that holds the plated substrate is taken out of the plating tank by the transporter, and is then transported to the next processing tank by the transporter.

If a failure occurs in the plating apparatus when the plating apparatus is performing plating of a substrate, it is possible that the substrate cannot be taken out of the plating tank. In particular, if a failure of the transporter, a failure of the plating tank, or a failure of the rinsing tank occurs when the substrate is being plated, it may become practically impossible to transport the substrate to the next process. As a result, the substrate remains in the plating tank, and is left immersed in the plating solution. If the substrate is in contact with the plating solution for a long time, a metal film that has been deposited on the substrate tends to be dissolved or deteriorated by the plating solution.

SUMMARY OF THE INVENTION

According to embodiments, there are provided a plating method and a plating apparatus which are capable of saving a substrate in an event of a failure of a transporter, a plating tank, or other component when the substrate is being plated.

Embodiments, which will be described below, relate to a method and an apparatus for plating a substrate, such as a wafer, and more particularly to a plating method and a plating apparatus which are capable of saving a substrate when a failure occurs in the plating apparatus.

In an embodiment, there is provided a plating method comprising: transporting a plurality of substrates to a plurality of plating tanks, respectively, with a transporter; immersing the plurality of substrates in a plating solution held in the plurality of plating tanks to plate the plurality of substrates; detecting a failure that has occurred in the transporter or a post-processing tank; and replacing the plating solution in the plurality of plating tanks with a preservative liquid to thereby immerse the plurality of substrates in the preservative liquid.

In an embodiment, replacing the plating solution comprises replacing the plating solution in the plurality of plating tanks with the preservative liquid in the order in which plating times preset respectively for the plurality of plating tanks have elapsed, to thereby immerse the plurality of substrates in the preservative liquid.

In an embodiment, the plurality of plating tanks comprise a plurality of plating cells and a plurality of overflow tanks, and the plating method further comprises, after replacing the plating solution with the preservative liquid, causing the preservative liquid to overflow the plurality of plating cells into the plurality of overflow tanks.

In an embodiment, the plating method further comprises delivering the plating solution in the plurality of plating tanks to a plating-solution reservoir.

In an embodiment, the plating method further comprises: draining the preservative liquid from the plurality of plating tanks; and supplying the plating solution from the plating-solution reservoir to the plurality of plating tanks.

In an embodiment, the preservative liquid comprises pure water or deaerated pure water.

In an embodiment, there is provided a plating method comprising: transporting a plurality of substrates to a plurality of plating tanks, respectively, with a transporter; immersing the plurality of substrates in a plating solution held in the plurality of plating tanks to plate the plurality of substrates; detecting a failure that has occurred in any one of the plurality of plating tanks while the plurality of substrates are being plated; and replacing the plating solution in the plating tank, in which the failure has occurred, with a preservative liquid to thereby immerse a substrate in the preservative liquid.

In an embodiment, replacing the plating solution comprises replacing the plating solution in the plating tank, in which the failure has occurred, with a preservative liquid to thereby immerse a substrate in the preservative liquid, while continuing plating substrates in other plating tanks.

In an embodiment, the plating tank comprise a plating cell and an overflow tank, and the plating method further comprises, after replacing the plating solution with the preservative liquid, causing the preservative liquid to overflow the plating cell into the overflow tank.

In an embodiment, the plating method further comprises delivering the plating solution in the plating tank to a plating-solution reservoir.

In an embodiment, the plating method further comprises: draining the preservative liquid from the plating tank; and supplying the plating solution from the plating-solution reservoir to the plating tank.

In an embodiment, the preservative liquid comprises pure water or deaerated pure water.

In an embodiment, there is provided a non-transitory computer-readable storage medium storing a program therein for causing a computer to instruct a plating apparatus to carry out a plating method comprising: transporting a plurality of substrates to a plurality of plating tanks, respectively, with a transporter; immersing the plurality of substrates in a plating solution held in the plurality of plating tanks to plate the plurality of substrates; detecting a failure that has occurred in the transporter or a post-processing tank; and replacing the plating solution in the plurality of plating tanks with a preservative liquid to thereby immerse the plurality of substrates in the preservative liquid.

In an embodiment, there is provided a plating apparatus comprising: a plurality of plating tanks having a plurality of plating cells and a plurality of overflow tanks; a transporter configured to transport a plurality of substrates to the plurality of plating tanks; a post-processing tank configured to perform post-processing of the plurality of substrates that have been plated in the plurality of plating tanks; a failure detector configured to detect a failure of the plurality of plating tanks, the transporter, and the post-processing tank; a plurality of plating-solution supply lines coupled to the plurality of plating tanks, respectively; a plurality of plating-solution discharge lines coupled to the plurality of plating tanks, respectively; and a plurality of preservative-liquid supply lines coupled to the plurality of plating tanks, respectively.

In an embodiment, the plating apparatus further comprises a plurality of drain lines coupled to the plurality of plating tanks, respectively.

In an embodiment, the plurality of preservative-liquid supply lines are coupled to the plurality of plating cells, respectively; and the plurality of drain lines are coupled to the plurality of plating cells and the plurality of overflow tanks.

In an embodiment, the plating apparatus further comprises: a plurality of preservative-liquid supply valves attached to the plurality of preservative-liquid supply lines, respectively; a plurality of drain valves attached to the plurality of drain lines, respectively; and an operation controller configured to operate the plurality of preservative-liquid supply valves and the plurality of drain valves.

In an embodiment, the plating apparatus further comprises a plating-solution reservoir coupled to the plurality of plating-solution supply lines and the plurality of plating-solution discharge lines.

In an embodiment, there is provided a system comprising: a plating apparatus including a plurality of plating tanks having a plurality of plating cells and a plurality of overflow tanks, a transporter configured to transport a plurality of substrates to the plurality of plating tanks, a post-processing tank configured to perform post-processing of the plurality of substrates which have been plated in the plurality of plating tanks, a failure detector configured to detect a failure of the plurality of plating tanks, the transporter, and the post-processing tank, a plurality of plating-solution supply lines coupled to the plurality of plating tanks, respectively, a plurality of plating-solution discharge lines coupled to the plurality of plating tanks, respectively, and a plurality of preservative-liquid supply lines coupled to the plurality of plating tanks, respectively; an edge server configured to extract feature data from operation data of the plating apparatus; and a computer configured to predict a failure of the plating apparatus based on the feature data.

According to the above-described embodiments, in the event that a failure of the transporter, a failure of the plating tank, or a failure of the other component occurs when substrates are being plated, the plating solution in the plating tanks is replaced with the preservative liquid. Since the plated substrates are placed in contact with the preservative liquid, instead of the plating solution, metal films that have been deposited on the respective substrates are prevented from being dissolved or deteriorated. Moreover, according to the above-described embodiment, the plating solution only in one of the plural plating tanks can selectively be replaced with the preservative liquid. Consequently, the other plating tank(s) is able to continue plating a substrate(s) therein.

BRIEF DESCRIPTION OF THE DRAWINGS

FIG. 8 is a flowchart illustrating an embodiment in which a plating solution is replaced with a rinsing liquid, instead of a preservative liquid;

FIG. 9 is a flowchart illustrating an example of a process of replacing a preservative liquid in plating tanks with a plating solution;

DESCRIPTION OF EMBODIMENTS

Embodiments will hereinafter be described below with reference to the drawings.

Figure 1:
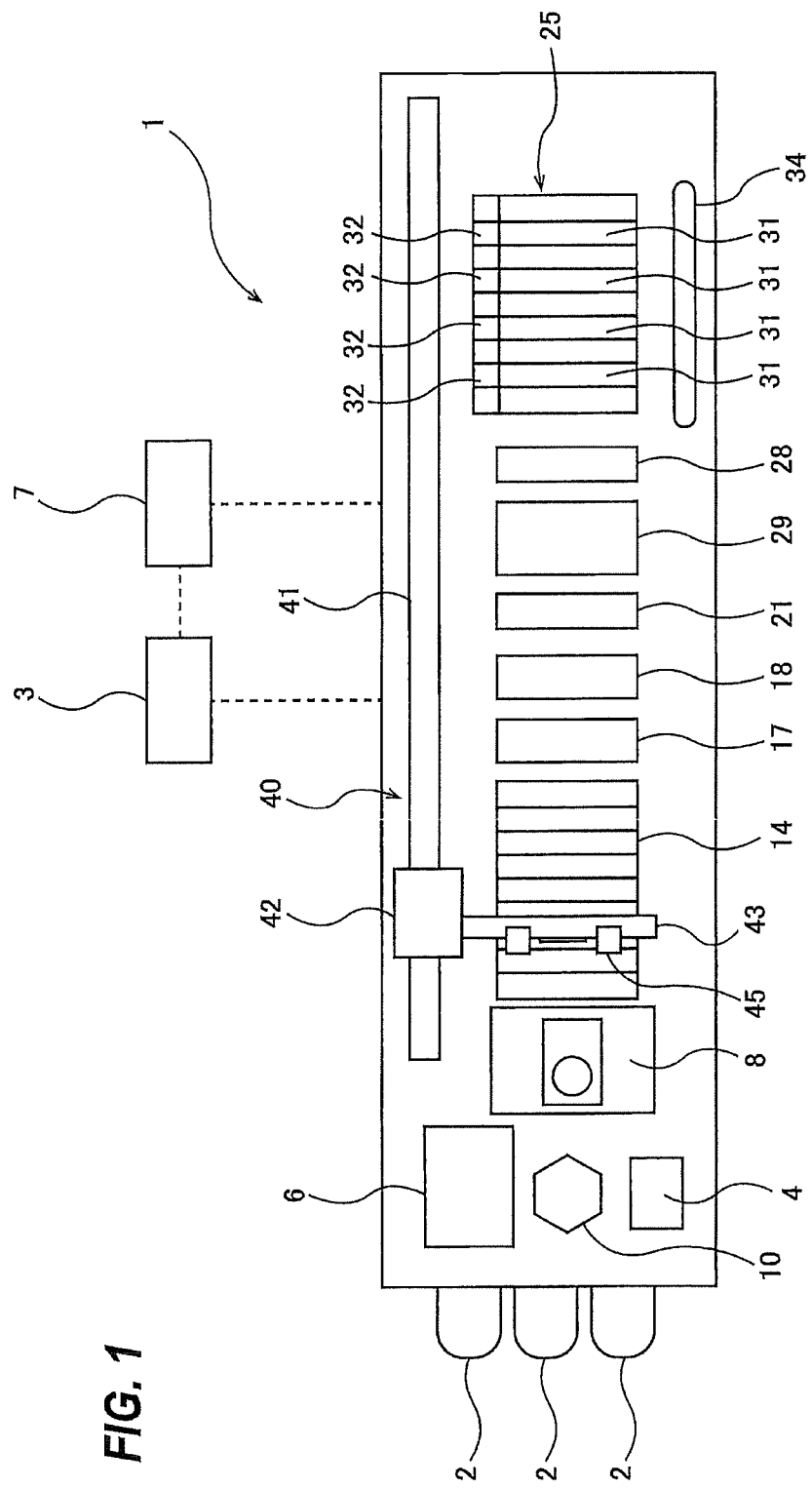
FIG. 1 is a plan view schematically showing an embodiment of a plating apparatus.

FIG. 1 is a plan view schematically showing an embodiment of a plating apparatus. As shown in FIG. 1, the plating apparatus, denoted by 1 includes three loading ports 2 on which cassettes, each housing a plurality of substrates such as wafers therein, are installed, an operation controller 3 for controlling operations of various devices of the plating apparatus 1, and a failure detector 7 for detecting a failure of the devices of the plating apparatus 1. The plating apparatus 1 further includes an aligner 4 for aligning a position of an orientation flat or a notch of a substrate, to be processed, in a predetermined direction, a spin-rinse drier (SRD) 6 for drying a processed substrate by rotating the processed substrate at a high speed, a fixing station 8 for loading a substrate onto a substrate holder, and a transfer robot 10 for transporting a substrate. The transfer robot 10 is arranged to be able to transport a substrate between the loading ports 2, the aligner 4, the spin-rinse drier 6, and the fixing station 8.

In this specification, the term "substrate" may refer to, for example, not only a semiconductor substrate, a glass substrate, and a printed circuit board, but also a magnetic recording medium, a magnetic recording sensor, a mirror, an optical element, a micro mechanical device, and a partially fabricated integrated circuit. The substrate may have on its surface a layer containing nickel or cobalt, for example. The substrate is not limited to a circular shape, but may be of a square shape or a polygonal shape, for example.

The plating apparatus 1 further includes a stocker 14 for storing substrate holders therein, a pre-cleaning tank (or a pre-wetting tank) 17 for pre-cleaning a substrate with a cleaning liquid such as pure water, a pre-soaking tank 18 for etching away an oxide film on a surface of a layer, such as a seed layer, that has been formed on the substrate, a first rinsing tank 21 for rinsing a substrate whose surface has been etched, a plurality of plating tanks 25 each for plating a surface of a substrate, a second rinsing tank 28 for rinsing a plated substrate with a rinsing liquid, and a blowing tank 29 for removing a liquid from a rinsed substrate.

The plurality of substrate holders are arranged in parallel in a vertical position in the stocker 14. The blowing tank 29 is configured to blow an air against a substrate, held by the substrate holder, to remove liquid droplets remaining on the surface of the substrate to thereby dry the substrate. A substrate that is held by the substrate holder is transported to the above-described various tanks in the order of the pre-cleaning tank 17, the pre-soaking tank 18, the first rinsing tank 21, the plating tank 25, the second rinsing tank 28, and the blowing tank 29. In the following descriptions, the pre-cleaning tank 17, the pre-soaking tank 18, the first rinsing tank 21, the plating tanks 25, the second rinsing tank 28, and the blowing tank 29 may occasionally be collectively referred to as processing tanks. In particular, the second rinsing tank 28 and the blowing tank 29 may be referred to as post-processing tank for performing post-processing of a plated substrate.

The plating tanks 25 include a plurality of plating cells 31 each for holding a plating solution therein, and a plurality of overflow tanks 32 disposed next to the plating cells 31, respectively. The number of plating cells 31 and the number of overflow tanks 32 are the same. Each of the plating tanks 25 functions as an electroplating tank which has an anode disposed therein. According to the present embodiment, a single type of plating solution is used in all of the plating tanks 25. The plating solution overflows each plating cell 31 into the adjacent overflow tank 32. The substrate holders, which hold substrates, respectively, are placed in the respective plating cells 31, and the substrates are electroplated while the substrates are immersed in the plating solution. A paddle driving unit 34 for driving agitation paddles, which will be described later, to agitate the plating solution in the plating cells 31 are disposed alongside of the plating tanks 25. In one embodiment, the plating tanks 25 may be a plurality of electroless plating tanks for performing electroless plating of substrates.

The plating apparatus 1 further includes a transporter 40 for transporting a substrate holder (the transporter 40 may also be referred to as a substrate transporting device). This transporter 40 is configured to transport a substrate holder (and a substrate held by the substrate holder) between the stocker 14, the fixing station 8, the pre-cleaning tank 17, the pre-soaking tank 18, the first rinsing tank 21, the plating tanks 25, the second rinsing tank 28, and the blowing tank 29. In order to increase a throughput of a substrate processing operation, the transporter 40 may include an upstream transporter and a downstream transporter.

The transporter 40 includes a moving mechanism 41 extending in a horizontal direction, a lifter 42 movable horizontally by the moving mechanism 41, and an arm 43 coupled to the lifter 42. The arm 43 and the lifter 42 are movable horizontally together, and the arm 43 is elevated and lowered by the lifter 42. According to the present embodiment, a combination of a servomotor and a rack-and-pinion is used as an actuator of the moving mechanism 41 for horizontally moving the lifter 42 and the arm 43.

Figure 2:
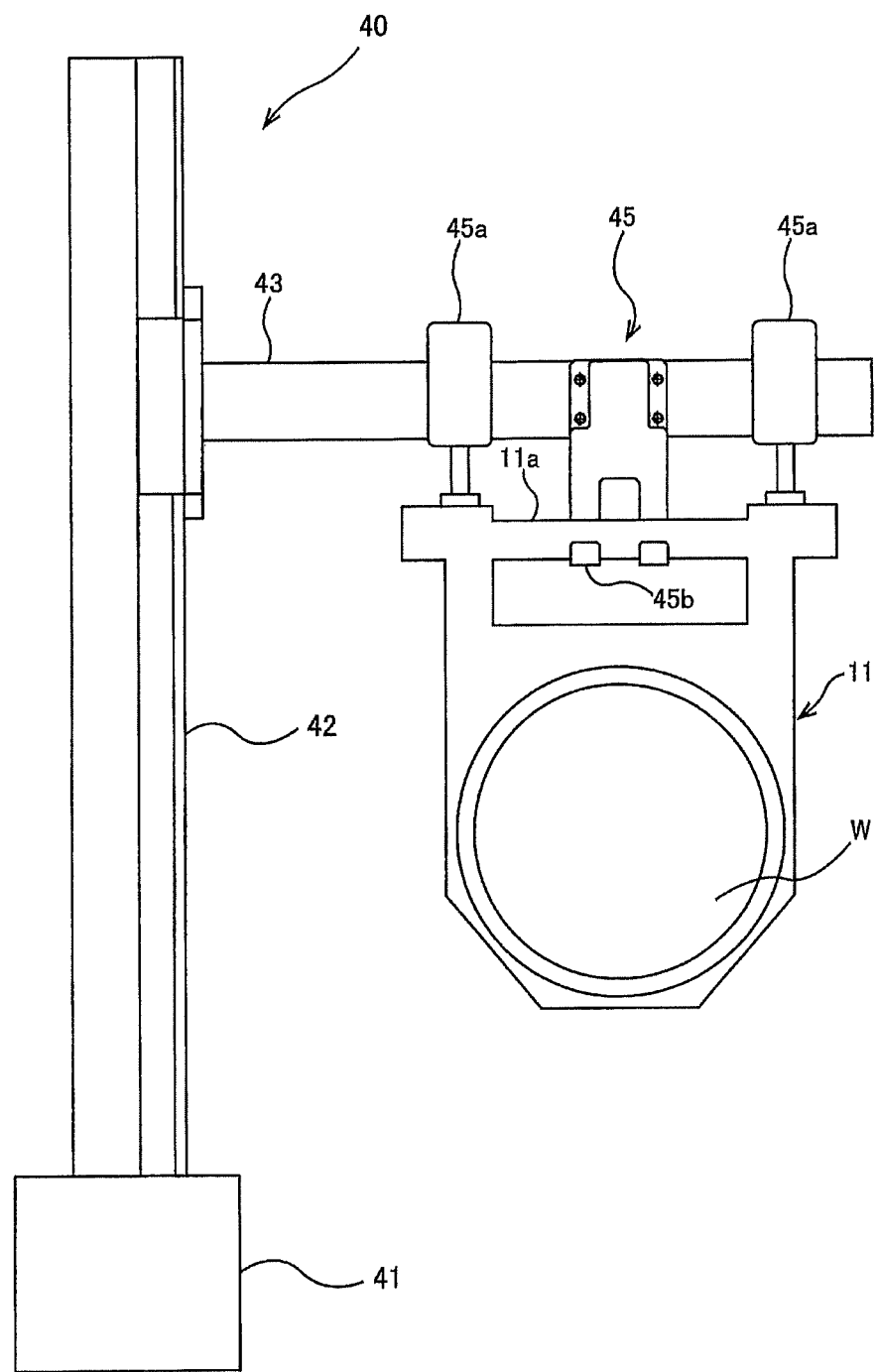
FIG. 2 is a front elevational view showing a lifter and an arm of a transporter.

FIG. 2 is a front elevational view showing the lifter 42 and the arm 43 of the transporter 40. The lifter 42 is configured to be able to elevate and lower the arm 43. According to the present embodiment, a combination of a servomotor and a rack-and-pinion is used as an actuator of the lifter 42 for elevating and lowering the arm 43. A substrate holder 11 is held by the arm 43 and is suspended from the arm 43.

The arm 43 has a hand 45 for gripping the substrate holder 11. The hand 45 includes two air cylinders 45*a* for pushing a hanger 11*a* of the substrate holder 11 downwardly, and further includes a hook 45*b* for supporting the hanger 11*a* of the substrate holder 11. The hook 45*b* is disposed between the two air cylinders 45*a*. The hook 45*b* is shaped so as to catch the hanger 11*a* of the substrate holder 11.

The substrate holder 11 is gripped by the hand 45 when the air cylinders 45*a* push the hanger 11*a* downwardly while the hanger 11*a* is caught on the hook 45*b*. The substrate holder 11 that is gripped or held by the hand 45 is transported in the vertical direction and the horizontal direction, without swaying, by the transporter 40. The hand 45 is not limited to the structure according to the present embodiment, but may be of other structures as long as the hand 45 can detachably hold the substrate holder 11.

Figure 3:
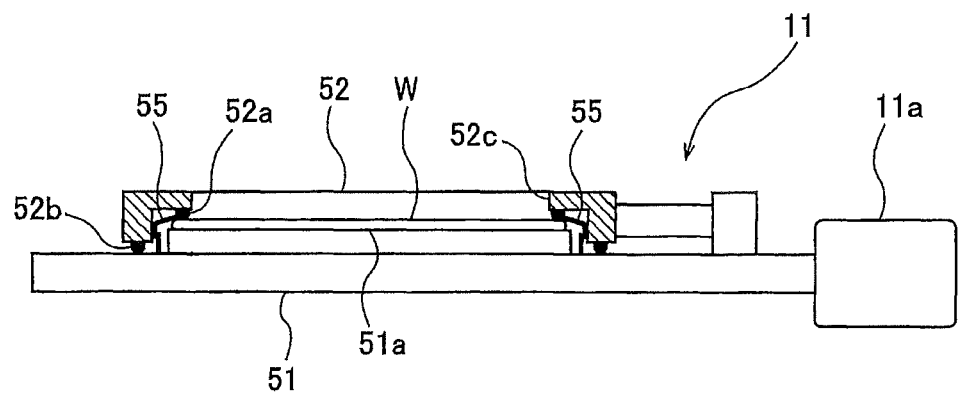
FIG. 3 is a schematic view of a substrate holder.

FIG. 3 is a schematic view of the substrate holder 11. The substrate holder 11 has a first holding member 51 and a second holding member 52 for sandwiching a substrate W therebetween. The first holding member 51 has a supporting surface 51*a* for supporting the substrate W. The second holding member 52 has a first seal ridge 52*a* capable of contacting a peripheral portion of the substrate W and a second seal ridge 52*b* capable of contacting the first holding member 51. The first seal ridge 52*a* can seal a gap between the substrate W and the second holding member 52, whereas the second seal ridge 52*b* can seal a gap between the first holding member 51 and the second holding member 52. The first seal ridge 52*a* and the second seal ridge 52*b* can form a hermetic space in the substrate holder 11, and electric contacts 55 for contact with the substrate W are disposed in this hermetic space. The second holding member 52 has an opening 52*c* defined therein which is slightly smaller than the size of the substrate W. The substrate W has a surface to be plated that is exposed through the opening 52*c*. The substrate W is processed in each of the above-described processing tanks while the substrate W is held by the substrate holder 11.

Figure 4:
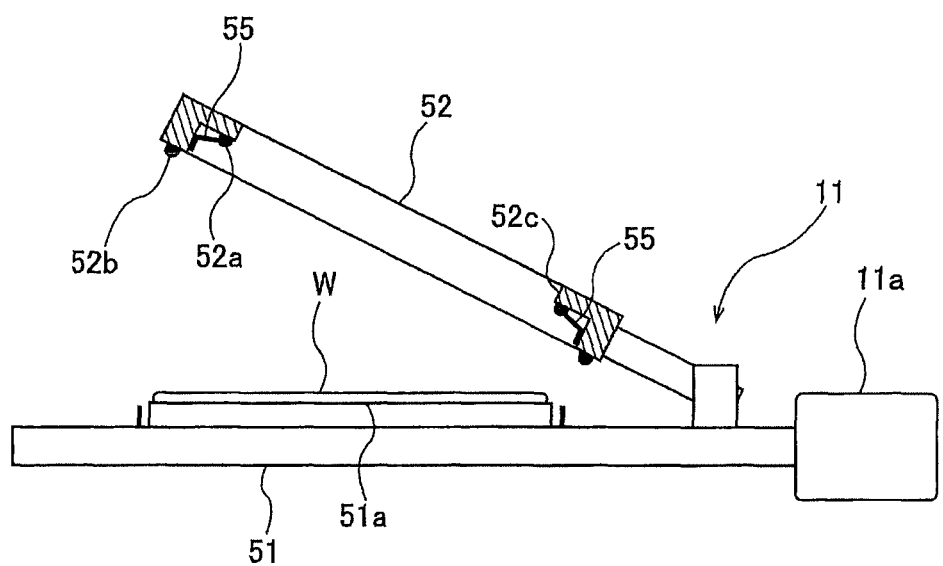
FIG. 4 is a schematic view showing a state in which the substrate holder is open.

The second holding member 52 is rotatably coupled to the first holding member 51. The second holding member 52 can be locked on the first holding member 51 by a locking mechanism which is not shown. FIG. 3 illustrates the second holding member 52 when it is locked on the first holding member 51, i.e., illustrates the substrate holder 11 when it is closed. The substrate W is held by the substrate holder 11 by being sandwiched between the first holding member 51 and the second holding member 52. When the second holding member 52 is released from the first holding member 51 by operating the locking mechanism, the second holding member 52 can be separated from the substrate W, as shown in FIG. 4, so that the substrate W can be taken out of the substrate holder 11. FIG. 4 illustrates the substrate holder 11 when it is open.

Next, operation of the plating apparatus 1 thus constructed will be described below. First, the arm 43 of the transporter 40 removes a substrate holder 11 in a vertical position from the stocker 14. The arm 43, which is holding the substrate holder 11, moves in the horizontal direction and transfers the substrate holder 11 to the fixing station 8. The fixing station 8 converts the substrate holder 11 from the vertical position into a horizontal position, and opens the substrate holder 11 (a state shown in FIG. 4 when the substrate W is not present).

The transfer robot 10 takes one substrate out of the cassette that has been placed on one of the loading ports 2, and places the substrate on the aligner 4. The aligner 4 aligns a position of an orientation flat or a notch of the substrate in a predetermined direction. The transfer robot 10 then removes the substrate from the aligner 4 and inserts the substrate into the substrate holder 11 on the fixing station 8. The fixing station 8 then closes the substrate holder 11 (see FIG. 3).

Then, the fixing station 8 converts the substrate holder 11 from the horizontal position into the vertical position. The hand 45 of the arm 43 grips the upright substrate holder 11, and the transporter 40 moves the substrate holder 11 horizontally to a position above the pre-cleaning tank 17. The lifter 42 of the transporter 40 lowers the arm 43 together with the substrate holder 11, and sets the substrate holder 11 at a predetermined position in the pre-cleaning tank 17. The pre-cleaning (or pre-wetting) of the substrate is performed while the substrate is held by the substrate holder 11. After the pre-cleaning of the substrate is terminated, the hand 45 of the arm 43 grips the substrate holder 11, and the lifter 42 elevates the arm 43 to thereby pull the substrate holder 11 upwardly from the pre-cleaning tank 17.

The transporter 40 then moves the substrate holder 11 horizontally to a position above the pre-soaking tank 18. The lifter 42 of the transporter 40 lowers the arm 43 together with the substrate holder 11, and sets the substrate holder 11 at a predetermined position in the pre-soaking tank 18. The etching of the surface of the substrate is performed while the substrate is held by the substrate holder 11. After the etching of the surface of the substrate is terminated, the hand 45 of the arm 43 grips the substrate holder 11, and the lifter 42 elevates the arm 43 to thereby pull the substrate holder 11 upwardly from the pre-soaking tank 18.

The transporter 40 then moves the substrate holder 11 horizontally to a position above the first rinsing tank 21. The lifter 42 of the transporter 40 lowers the arm 43 together with the substrate holder 11, and sets the substrate holder 11 at a predetermined position in the first rinsing tank 21. The rinsing of the substrate is performed while the substrate is held by the substrate holder 11. After the rinsing of the substrate is terminated, the hand 45 of the arm 43 grips the substrate holder 11, and the lifter 42 elevates the arm 43 to thereby pull the substrate holder 11 upwardly from the first rinsing tank 21.

The transporter 40 then moves the substrate holder 11 horizontally to a position above one of the plating tanks 25. The lifter 42 of the transporter 40 lowers the arm 43 together with the substrate holder 11, and sets the substrate holder 11 at a predetermined position in the plating cell 31 of the plating tank 25. The plating of the substrate is performed while the substrate is held by the substrate holder 11.

The above-discussed processes of pre-cleaning, etching, and rinsing are performed in the same manner until substrates are placed in all of the plating tanks 25. Each of the substrates is immersed in the plating solution until a preset plating time elapses, and is plated for the plating time. When the plating time has elapsed, the substrate held by the substrate holder 11 is taken out of the plating tank 25 by the arm 43. Different plating times may be set for the plating tanks 25.

After the plating of the substrate is terminated, the hand 45 of the arm 43 grips the substrate holder 11, and the lifter 42 elevates the arm 43 to thereby pull the substrate holder 11 upwardly from the plating cell 31. The transporter 40 then moves the substrate holder 11 horizontally to a position above the second rinsing tank 28. The lifter 42 of the transporter 40 then lowers the arm 43 together with the substrate holder 11, and sets the substrate holder 11 in a predetermined position in the second rinsing tank 28. The rinsing of the substrate is performed while the substrate is held by the substrate holder 11. After the rinsing of the substrate is terminated, the hand 45 of the arm 43 grips the substrate holder 11, and the lifter 42 elevates the arm 43 to thereby pull the substrate holder 11 upwardly from the second rinsing tank 28.

The transporter 40 moves the substrate holder 11 horizontally to a position above the blowing tank 29. The lifter 42 of the transporter 40 then lowers the arm 43 together with the substrate holder 11, and sets the substrate holder 11 at a predetermined position in the blowing tank 29. The blowing tank 29 blows an air against the substrate held by the substrate holder 11 to remove liquid droplets attached to the surface of the substrate, thereby drying the substrate. After the blowing process is terminated, the hand 45 of the arm 43 grips the substrate holder 11, and the lifter 42 elevates the arm 43 to thereby pull the substrate holder 11 upwardly from the blowing tank 29.

The arm 43 moves in the horizontal direction and transfers the substrate holder 11 to the fixing station 8. The fixing station 8 opens the substrate holder 11 in the same manner as described above. The transfer robot 10 removes the processed substrate from the substrate holder 11, and transports the substrate to the spin-rinse drier 6. The spin-rinse drier 6 dries the substrate by rotating the substrate at a high speed. The transfer robot 10 removes the dried substrate from the spin-rinse drier 6, and returns the substrate to the cassette installed on the loading port 2. The processing of the substrate now comes to an end.

Figure 5:
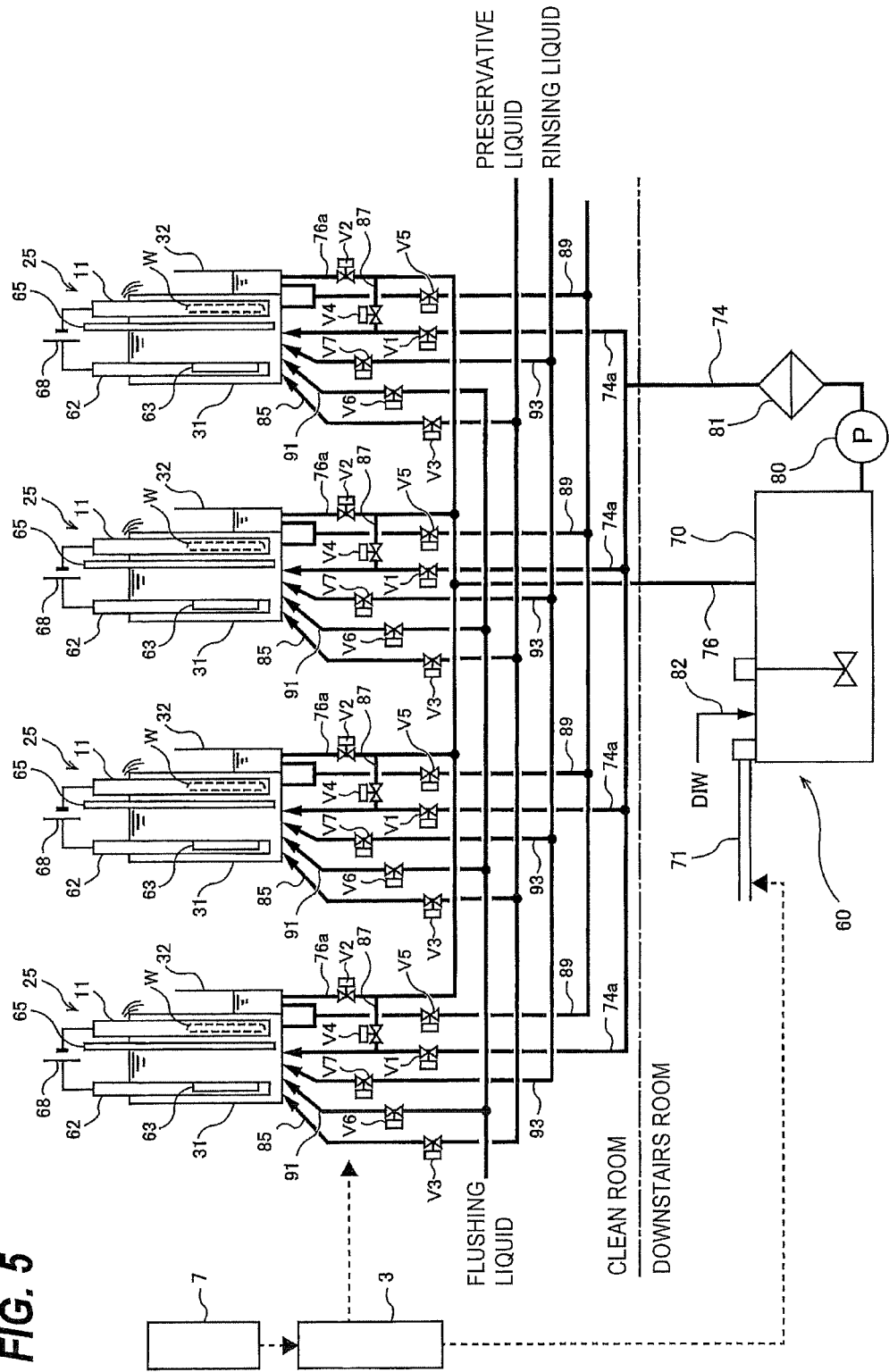
FIG. 5 is a view showing a plurality of plating tanks.

FIG. 5 is a view of the plating tanks 25. The plating apparatus 1 that includes the plating tanks 25 is installed in a clean room. In FIG. 5, only four of the plating tanks 25 are shown. A plating-solution supply apparatus 60 is installed in a downstairs room. According to the present embodiment, each of the plating tanks 25 is a plating unit for electroplating a substrate, such as a wafer, with copper. The plating-solution supply apparatus 60 is a plating-solution supply unit configured to supply powder containing at least copper into a plating solution to be used in the plating tanks 25. In one embodiment, a metal to be plated on the surface of the substrate may be nickel (Ni), tin (Sn), Sn—Ag alloy, or cobalt (Co), instead of copper (Cu).

An insoluble anode 63, held by an anode holder 62, is disposed in each of the plating cells 31. A neutral membrane (not shown) is disposed around the insoluble anode 63 in each plating cell 31. The plating cells 31 are filled with the plating solution, which overflows the plating cells 31 into the overflow tanks 32. An agitation paddle 65 is disposed in each of the plating cells 31. The agitation paddle 65 reciprocates parallel to a substrate W to thereby agitate the plating solution, so that sufficient copper ions and additives can be supplied uniformly to the surface of the substrate W.

The substrate W, such as a wafer, is held by the substrate holder 11, and immersed, together with the substrate holder 11, in the plating solution held in the plating cell 31 of the plating tank 25. The insoluble anode 63 is electrically connected to a positive pole of a plating power supply 68 through the anode holder 62, and the substrate W, held by the substrate holder 11, is electrically connected to a negative pole of the plating power supply 68 through the substrate holder 11. When the plating power supply 68 applies a voltage between the insoluble anode 63 and the substrate W that are immersed in the plating solution, an electrochemical reaction occurs in the plating solution. As a result, copper is deposited on the surface of the substrate W. The surface of the substrate W is plated with copper in this manner.

The operation controller 3 has a function to calculate a concentration of copper ions contained in the plating solution from a cumulative value of electric current that has flowed in the substrate W. As the substrate W is plated, the copper in the plating solution is consumed. An amount of copper consumed is proportional to the cumulative value of the electric current that has flowed in the substrate W. Therefore, the operation controller 3 can calculate the concentration of copper ions contained in the plating solution from the cumulative value of the electric current. In one embodiment, a concentration measuring device for measuring the concentration of copper ions in the plating solution may be provided in at least one of the plating tanks 25. Furthermore, the operation controller 3 may periodically calculate an amount of powder of copper oxide to be newly added to the plating solution on the basis of the concentration of copper ions in the plating solution that is measured by the concentration measuring device, and the plating-solution supply apparatus 60 may supply the calculated amount of powder of copper oxide into the plating solution.

The plating-solution supply apparatus 60 includes a plating-solution reservoir 70, and further includes a feeder 71 for supplying powder of copper oxide into the plating-solution reservoir 70. An acidic copper sulfate plating solution containing sulfuric acid, copper sulfate, halogen ions, and organic additives, in particular a plating accelerator e.g. comprising SPS (bis(3-sulfopropyl) disulfide), a suppressor e.g. comprising PEG (polyethylene glycol) and a leveler e.g. comprising PEI (polyethylenimine), may be used as the plating solution. Chloride ions are preferably used as the halogen ions.

The plating tanks 25 and the plating-solution supply apparatus 60 are coupled to each other by a plurality of plating-solution supply lines 74a and a plurality of plating-solution discharge lines 76a. The plating-solution supply lines 74a extend from the plating-solution reservoir 70 to the plating cells 31 of the plating tanks 25. More specifically, the plating-solution supply lines 74a are coupled to the bottoms of the plating cells 31, respectively. In one embodiment, the plating-solution supply lines 74a may be coupled to sides of the plating cells 31, respectively. According to the present embodiment, the plating-solution supply lines 74a are collected to form a single main supply line 74. This main supply line 74 is coupled to the plating-solution reservoir 70 of the plating-solution supply apparatus 60.

Plating-solution supply valves V1 are attached to the plating-solution supply lines 74a, respectively. The operation controller 3 is configured to control the operations of the plating-solution supply valves V1. Each of the plating-solution supply valves V1 comprises a flow-rate control valve capable of regulating the flow rate of the plating solution. The operation controller 3 can operate the plating-solution supply valves V1 independently of each other.

The plating-solution discharge lines 76a extend from the respective bottoms of the overflow tanks 32 to the plating-solution reservoir 70. The plating-solution discharge lines 76a are coupled to the bottoms of the overflow tanks 32, respectively. In one embodiment, the plating-solution discharge lines 76a may be coupled to sides of the plating cells 31, respectively. According to the present embodiment, the plating-solution discharge lines 76a are collected to form a single main discharge line 76. This main discharge line 76 is coupled to the plating-solution reservoir 70 of the plating-solution supply apparatus 60. Plating-solution discharge valves V2 are attached to the plating-solution discharge lines 76a, respectively. Each of the plating-solution discharge valves V2 comprises a flow-rate control valve capable of regulating the flow rate of the plating solution. The operation controller 3 can operate the plating-solution discharge valves V2 independently of each other.

The main supply line 74 that constitutes the plating-solution supply lines 74a is provided with a pump 80 for delivering the plating solution, and is further provided with a temperature regulator 81 disposed downstream of the pump 80. A pure-water supply line 82 for supplying pure water (DIW) into the plating solution is coupled to the plating-solution reservoir 70. The plating solution that has been used in the plating tanks 25 is delivered through the plating-solution discharge lines 76a to the plating-solution supply apparatus 60, which adds the powder of copper oxide to the plating solution. The plating solution with the added powder of copper oxide is delivered through the plating-solution supply lines 74a to the plating tanks 25. The pump 80 may circulate the plating solution at all times between the plating tanks 25 and the plating-solution supply apparatus 60, or may intermittently deliver a predetermined amount of plating solution from the plating tanks 25 to the plating-solution supply apparatus 60 and may intermittently return the plating solution, to which the powder of copper oxide has been added, from the plating-solution supply apparatus 60 to the plating tanks 25.

The operation controller 3 is electrically connected to the feeder 71 of the plating-solution supply apparatus 60. The operation controller 3 is configured to send a signal indicating a replenishment demand value to the feeder 71 when the concentration of copper ions in the plating solution is lowered below a set value. Upon receiving this signal, the feeder 71 adds the powder of copper oxide to the plating solution until the amount of powder of copper oxide added reaches the replenishment demand value. The operation controller 3 may comprise a computer that operates in accordance with a program.

The plating apparatus 1 further includes a plurality of preservative-liquid supply lines 85 coupled to the plating tanks 25, respectively. According to the present embodiment, the preservative-liquid supply lines 85 are coupled to the bottoms of the plating cells 31, respectively. Preservative-liquid supply valves V3 are attached to the preservative-liquid supply lines 85, respectively. In one embodiment, the preservative-liquid supply lines 85 may be coupled to sides of the plating cells 31, respectively. When the preservative-liquid supply valves V3 are opened, a preservative liquid is supplied through the preservative-liquid supply lines 85 into the plating cells 31.

The preservative liquid is an inactive liquid capable of maintaining a state of a metal film formed on a substrate without substantially inducing a chemical reaction on the metal film. Specifically, the preservative liquid comprises a liquid which does not dissolve and oxidize a metal film formed on a substrate and which does not substantially affect the plating of the substrate even if a small amount of preservative liquid is mixed into the plating solution. Examples of the preservative liquid include pure water (DIW), and a neutral or slightly acid liquid with a pH of 4 to 7 containing at least the same components as the plating solution and containing an additive for protecting a surface layer. If a substrate is to be plated with copper, the preservative liquid may preferably be deaerated pure water, in order to prevent oxidation of copper.

The operation controller 3 can operate the preservative-liquid supply valves V3 independently of each other. For example, the operation controller 3 may open one of the preservative-liquid supply valves V3 to supply the preservative liquid to only the plating cell 31 that is in fluid communication with the opened preservative-liquid supply valve V3.

The plating-solution supply lines 74a and the plating-solution discharge lines 76a, which are coupled to the respective plating tanks 25, are coupled to each other by bypass lines 87. Bypass valves V4 are attached to the bypass lines 87, respectively. The plating apparatus 1 further includes a plurality of drain lines 89 coupled to the plating tanks 25, respectively. The drain lines 89 are coupled to the bottoms of both the plating cells 31 and the overflow tanks 32 of the respective plating tanks 25. Drain valves V5 are attached to the drain lines 89, respectively. In one embodiment, the drain lines 89 may be coupled to sides of both the plating cells 31 and the overflow tanks 32 of the respective plating tanks 25.

When the drain valves V5 are opened, the preservative liquid is drained from the plating cells 31 and the overflow tanks 32 through the drain lines 89. The operation controller 3 can operate the drain valves V5 independently of each other. For example, the operation controller 3 may open one of the drain valves V5 to drain the preservative liquid from only the plating cell 31 and the overflow tank 32 that are in fluid communication with the opened drain valve V5.

The plating apparatus 1 further includes a plurality of flushing lines 91 coupled to the plating tanks 25, respectively. The flushing lines 91 are coupled to the bottoms of the plating cells 31, respectively. Flushing valves V6 are attached to the flushing lines 91, respectively. In one embodiment, the flushing lines 91 may be coupled to sides of the plating cells 31, respectively. When the flushing valves V6 are opened, a flushing liquid is supplied through the flushing lines 91 into the plating cells 31. The operation controller 3 can operate the flushing valves V6 independently of each other. For example, the operation controller 3 may open one of the flushing valves V6 to supply the flushing liquid to only the plating cell 31 that is in fluid communication with the opened flushing valve V6.

The plating apparatus 1 further includes a plurality of rinsing-liquid supply lines 93 coupled to the plating tanks 25, respectively. The rinsing-liquid supply lines 93 are coupled to the bottoms of the respective plating cells 31. Rinsing-liquid supply valves V7 are attached to the rinsing-liquid supply lines 93, respectively. In one embodiment, the rinsing-liquid supply lines 93 may be coupled to sides of the respective plating cells 31. When the rinsing-liquid supply valves V7 are opened, a rinsing liquid is supplied through the rinsing-liquid supply lines 93 to the plating cells 31. The operation controller 3 can operate the rinsing-liquid supply valves V7 independently of each other. For example, the operation controller 3 may open one of the rinsing-liquid supply valves V7 to supply the rinsing liquid to only the plating cell 31 that is in fluid communication with the opened rinsing-liquid supply valve V7.

The plating apparatus 1 further includes the failure detector 7 for detecting the occurrence of a failure and emitting an alarm signal indicting the occurrence of the failure on the basis of signals sent from the processing tanks and the transporter 40. When the operation controller 3 receives the alarm signal from the failure detector 7, the operation controller 3 operates the plating-solution supply valve(s) V1, the plating-solution discharge valve(s) V2, the preservative-liquid supply valve(s) V3, and the bypass valve(s) V4 to replace the plating solution in at least one of the plating tanks 25 with the preservative liquid. The plated substrate is immersed in the preservative liquid, so that a state of a metal film that has been formed on the substrate can be maintained. In this specification, the operation of replacing the plating solution in the plating tank 25 with the preservative liquid refers to an operation of discharging the plating solution from the plating tank 25 and then supplying the preservative liquid into that plating tank 25.

The reason for replacing the plating solution in the plating tank 25 with the preservative liquid is as follows. If the plating apparatus 1 suffers a failure when plating of a substrate is being performed in the plating tank 25, it is possible that the substrate cannot be taken out of the plating tank 25. In particular, if a failure of the transporter 40, a failure of the plating tank 25, or a failure of the second rinsing tank 28 occurs when the substrate is being plated, it may become practically impossible to transport the substrate to the next process. As a result, the substrate remains in the plating tank 25, and is left immersed in the plating solution. If the substrate is in contact with the plating solution for a long time, a metal film that has been deposited on the substrate tends to be dissolved or deteriorated by the plating solution. Thus, in case a failure is detected by the failure detector 7, in order to save the substrate, the plating solution in the plating tank 25 is replaced with the preservative liquid. Specific examples of failures that require the plating solution to be replaced with the preservative liquid will be described below.

1. Failure of the Transporter 40

(i) Hand

Open and closed positions of the hand 45 shown in FIG. 2 are detected by hand sensors (not shown). These hand sensors are configured to send a hand detection signal to the failure detector 7 when the hand 45 has reached a predetermined open position and send a hand detection signal to the failure detector 7 when the hand 45 has reached a predetermined closed position. If the failure detector 7 has not received the hand detection signal within a set time, then the failure detector 7 sends an alarm signal indicating a failure of the transporter 40 to the operation controller 3.

(ii) Servomotor

When a servomotor for vertically moving the arm 43 is overloaded or a servomotor for horizontally moving the arm 43 is overloaded, an overload signal is sent from a driver of the servomotor to the failure detector 7. Upon receiving the overload signal, the failure detector 7 sends an alarm signal indicating a failure of the transporter 40 to the operation controller 3.

(iii) Loss of an Absolute Position of the Arm 43

When the above-described servomotor has lost an absolute position of the arm 43, a position loss signal is sent from the driver of the servomotor to the failure detector 7. Upon receiving the position loss signal, the failure detector 7 sends an alarm signal indicating a failure of the transporter 40 to the operation controller 3.

2. Failure of a Clamp Mechanism of the Plating Tank 25

The substrate holder 11 is fixed to the plating cell 31 by a clamp mechanism (not shown) so that the substrate holder 11 does not sway when the agitation paddle 65 is reciprocating during plating of a substrate. After the plating of the substrate, the clamp mechanism moves to an unclamping position, where the clamp mechanism releases the substrate holder 11. When the clamp mechanism has moved to the unclamping position, the clamp mechanism sends an unclamp signal to the failure detector 7. If the failure detector 7 has not received the unclamp signal within a set time, then the failure detector 7 sends an alarm signal indicating a failure of the clamp mechanism of the plating tank 25 to the operation controller 3.

3. Failure of the Plating Power Supply 68

(i) Plating Voltage

During a plating process in each of the plating tanks 25, the plating power supply 68 applies a plating voltage to a substrate and the anode 63. If the plating power supply 68 detects that the plating voltage has exceeded an upper limit value, then the plating power supply 68 sends a voltage error signal to the failure detector 7. Upon receiving the voltage error signal, the failure detector 7 sends an alarm signal indicating a failure of the plating power supply 68 of the plating tank 25 to the operation controller 3.

(ii) Communications

When a plating process is to be started, if the failure detector 7 has not received a response signal from the plating power supply 68 within a set time in response to a communication command, then the failure detector 7 sends an alarm signal indicating a failure of the plating power supply 68 of the plating tank 25 to the operation controller 3.

4. Failure of the Second Rinsing Tank 28

(i) Liquid Level in the Second Rinsing Tank 28

The second rinsing tank 28 is configured to pour a rinsing liquid (e.g., pure water) into its interior to immerse a plated substrate in the rinsing liquid, thereby rinsing the plated substrate. The second rinsing tank 28 is provided with three liquid level sensors (not shown) including an upper limit level sensor, a high level sensor, and a low level sensor each for detecting a liquid level. When the upper limit level sensor, the high level sensor, and the low level sensor detect the liquid levels, these sensors emit an upper-limit level detection signal, a high-level detection signal, and a low-level detection signal, respectively.

If the failure detector 7 has received the upper-limit level detection signal, then the failure detector 7 sends an alarm signal indicating a failure of the second rinsing tank 28 to the operation controller 3.

(ii) Liquid Level Sensor

If the failure detector 7 does not receive the low-level detection signal from the low level sensor, despite the fact that the failure detector 7 has received the high-level detection signal from the high level sensor, then the failure detector 7 sends an alarm signal indicating a failure of the second rinsing tank 28, i.e., a failure of the low level sensor, to the operation controller 3.

(iii) Pressure of the Rinsing Liquid

A pressure sensor (not shown) is coupled to a rinsing-liquid supply line that supplies the rinsing liquid into the second rinsing tank 28. This pressure sensor is configured to measure the pressure of the rinsing liquid in the rinsing-liquid supply line. If the pressure of the rinsing liquid is lower than a lower limit value, then the pressure sensor sends a lower-limit detection signal to the failure detector 7. Upon receiving the lower-limit detection signal, the failure detector 7 sends an alarm signal indicating a failure of the second rinsing tank 28 to the operation controller 3.

5. Failure of the Blowing Tank 29

The pressure of a gas (e.g., a nitrogen gas) to be blown against the substrate is measured by a pressure sensor (not shown). If the pressure of the gas is lower than a lower limit value, then the pressure sensor sends a lower-limit detection signal to the failure detector 7. Upon receiving the lower-limit detection signal, the failure detector 7 sends an alarm signal indicating a failure of the blowing tank 29 to the operation controller 3.

Upon receiving the above-discussed alarm signal, the operation controller 3 operates the plating-solution supply valve(s) V1, the plating-solution discharge valve(s) V2, the preservative-liquid supply valve(s) V3, and the bypass valve(s) V4 to replace the plating solution in at least one of the plating tanks 25 with the preservative liquid. An embodiment of a process of replacing the plating solution in the plating tank 25 with preservative liquid will be described below. In the following descriptions, the second rinsing tank 28 and the blowing tank 29 may be collectively referred to as post-processing tank.

Figure 6:
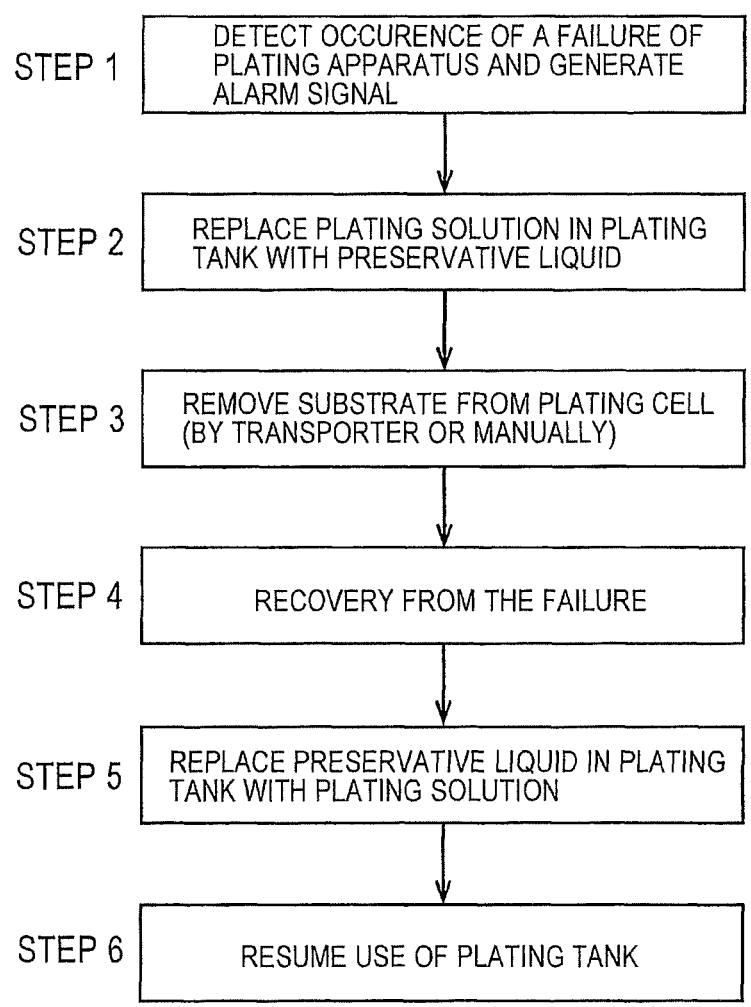
FIG. 6 is a flowchart illustrating an example of operation after the occurrence of a failure.

FIG. 6 is a flowchart illustrating an example of operation after the occurrence of a failure. The failure detector 7 detects a failure on the basis of the signal from the transporter 40, the plating tank 25, the second rinsing tank 28, or the blowing tank 29, and sends the alarm signal indicating the occurrence of the failure of the plating apparatus to the operation controller 3 (step 1). The operation controller 3 operates the plating-solution supply valve V1, the plating-solution discharge valve V2 the preservative-liquid supply valve V3, and the bypass valve V4 to replace the plating solution in the plating tank 25 with the preservative liquid (step 2). The substrate is immersed in the preservative liquid. The plating solution may be replaced with the preservative liquid after a preset plating time has elapsed, i.e., after the plating of the substrate has been completed.

In a case where the transporter 40 works normally, the transporter 40 removes the substrate from the plating tank 25 (step 3). If the transport 40 does not work, then the substrate may be manually removed from the plating tank 25. After the plating apparatus 1 has recovered from the failure (step 4), the operation controller 3 operates the plating-solution supply valve V1, the plating-solution discharge valve V2, the preservative-liquid supply valve V3, and the bypass valve V4 to replace the preservative liquid in the plating tank 25 with the plating solution (step 5). The plating tank 25 can be used to plate a next substrate therein (step 6).

If it is possible that the surface of the anode 63 is oxidized as a result of the replacement of the preservative liquid, a reverse voltage may be applied between the anode 63 and the substrate after the preservative liquid is replaced with the plating solution so as to remove an oxide film from the surface of the anode 63. After the plating solution has been returned to the plating tank 25, the substrate that have been left in the plating tank 25 may be plated again. In this case, immediately after the plating solution has been returned to the plating tank 25, a reverse voltage may be applied between the anode 63 and the substrate so as to remove an oxide film from the surface of the anode 63, and then the substrate may be plated again. More specifically, the operation controller 3 may calculate a period of time that has elapsed immediately after the previous plating of the substrate remaining in the plating tank 25 was interrupted or terminated, and set recipe conditions including a film thickness that is assumed to be dissolved away during the elapsed time, and a plating time and a plating current required for a present film thickness to reach a target film thickness, so that the substrate is plated again.

The film thickness that is assumed to be dissolved away during the period of time that has elapsed immediately after the previous plating of the substrate remaining in the plating tank 25 was interrupted or terminated may possibly vary depending on the type of film formed on the substrate. Therefore, a database representing a relationship between the type of substrate, elapsed time, and film thickness assumed to be dissolved away during the elapsed time may be stored in a memory of the operation controller 3, and the recipe conditions may be set using the database.

The plating of the substrate is terminated when a preset plating time has elapsed. The plating time of the substrate is preset for each of the plating tanks 25. The plating time may vary between the plating tanks 25. Substrates are introduced into the respective plating tanks 25 with certain time differences. Typically, therefore, the times at which the plating of the substrates is to be completed are different between the plating tanks 25.

If a failure has occurred only in one of the plating tanks 25 (e.g., if a failure has occurred in the plating power supply 68 or the clamp mechanism of one plating tank 25), the plating solution only in that plating tank 25 is replaced with the preservative liquid. If that plating tank 25 is able to continue the plating of the substrate, the plating solution is replaced with the preservative liquid after a plating time preset for that plating tank 25 has elapsed (i.e., after the plating of the substrate in that plating tank 25 is completed).

If it is necessary to replace the plating solution in all the plating tanks 25 with the preservative liquid (e.g., if a failure has occurred in the transporter 40, the second rinsing tank 28, or the blowing tank 29), then the plating solution in the plating tanks 25 is replaced with the preservative liquid in the order in which the plating times preset for the respective plating tanks 25 have elapsed (i.e., in the order in which the plating of the substrates has been completed). According to such an operation, the plating of all of the substrates can be completed in all of the plating tanks 25.

Figure 7:
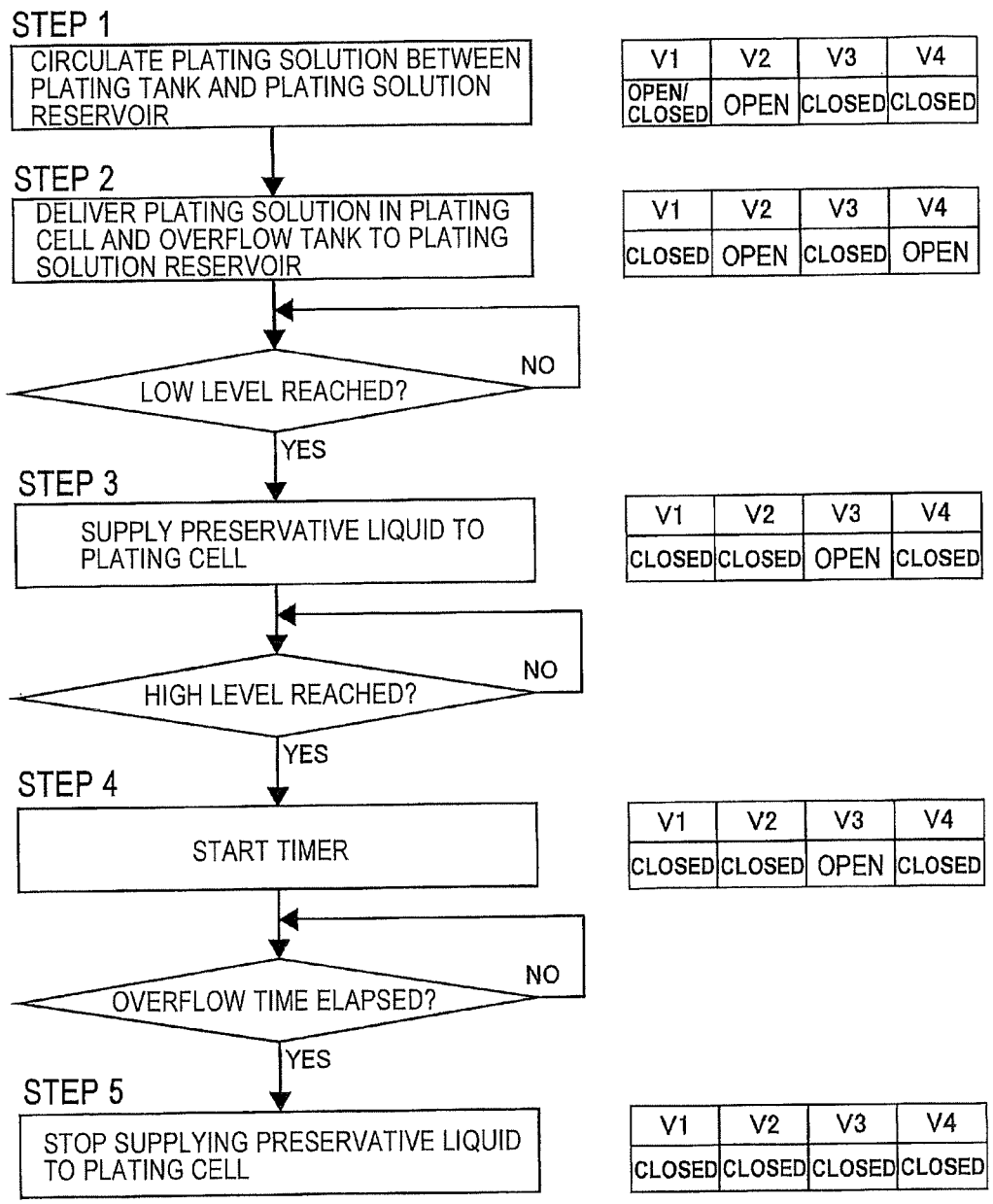
FIG. 7 is a flowchart illustrating an example of a process of replacing a plating solution in plating tanks with a preservative liquid.

Next, an example of process of replacing the plating solution in the plating tank 25 with the preservative liquid will be described below with reference to a flowchart shown in FIG. 7. The operation controller 3 operates the plating-solution supply valve V1 and the plating-solution discharge valve V2 to circulate the plating solution between the plating tank 25 and the plating-solution reservoir 70 (step 1). More specifically, the plating solution is delivered from the plating-solution reservoir 70 to the plating cell 31, overflows the plating cell 31 into the overflow tank 32, and is returned from the overflow tank 32 to the plating-solution reservoir 70. In one embodiment, the operation controller 3 opens the plating-solution supply valve V1 and the plating-solution discharge valve V2 to circulate the plating solution continuously between the plating tank 25 and the plating-solution reservoir 70. In another embodiment, the operation controller 3 may open and close the plating-solution supply valve V1 at predetermined time intervals while keeping the plating-solution discharge valve V2 fully open, thereby intermittently circulating the plating solution between the plating tank 25 and the plating-solution reservoir 70.

If the operation controller 3 receives the alarm signal, then the operation controller 3 closes the plating-solution supply valve V1 and then opens the bypass valve 4. In the case where the operation controller 3 receives the alarm signal from one of the plating tanks 25, the operation controller 3 may preferably gradually close the plating-solution supply valve V1 over a period of time ranging from 1 second to 60 seconds, in order to prevent the increase in the flow rate of the plating solution flowing into the other plating tanks 25. When the plating-solution supply valve V1 is closed, the supply of the plating solution to the plating tank 25 is stopped. The plating-solution discharge valve V2 is fully open. The plating solution in the plating cell 31 flows through the bypass line 87 into the plating-solution discharge line 76a. Consequently, the plating solution in the plating cell 31 and the overflow tank 32 is delivered (or discharged) through the plating-solution discharge line 76a to the plating-solution reservoir 70 (step 2).

After a liquid level sensor (not shown in the drawing) has detected that the level of the plating solution in the plating cell 31 has dropped to a low level, the operation controller 3 closes the plating-solution discharge valve V2 and the bypass valve V4 and then opens the preservative-liquid supply valve V3. The preservative liquid is supplied through the preservative-liquid supply line 85 into the plating cell 31 (step 3). The plating solution in the plating cell 31 is replaced with the preservative liquid, so that the substrate in the plating cell 31 is immersed in the preservative liquid.

After a liquid level sensor (not shown in the drawing) has detected that the level of the preservative liquid in the plating cell 31 has risen to a high level, the operation controller 3 starts a timer (step 4), The preservative liquid overflows the plating cell 31 into the overflow tank 32. When a preset overflow time has elapsed from the start of the timer, the operation controller 3 closes the preservative-liquid supply valve V3. As a result, the supply of the preservative liquid to the plating cell 31 is stopped (step 5).

In the case where the preservative liquid is pure water, the operation controller 3 may close the preservative-liquid supply valve V3 when an electric resistance of the preservative liquid has reached a threshold value, instead of monitoring the overflow time. The threshold value is selected from a range of 1 M$\Omega$ to 18 M$\Omega$. In the case where the preservative liquid is slightly acid, the operation controller 3 may close the preservative-liquid supply valve V3 when the pH of the preservative liquid has fallen within a set range (e.g., 6 to 7). In order to reduce the amount of the preservative liquid used, the preservative liquid may be periodically caused to overflow. For example, the preservative liquid may be caused to overflow for several seconds at one-minute intervals.

Next, an embodiment in which the plating solution is replaced with the rinsing liquid, instead of the preservative liquid, will be described below with reference to a flowchart shown in FIG. 8. According to this embodiment, the plating solution is replaced with the rinsing liquid as follows. The operation controller 3 operates the plating-solution supply valve V1 and the plating-solution discharge valve V2 to circulate the plating solution continuously or intermittently between the plating tank 25 and the plating-solution reservoir 70 (step 1). When the operation controller 3 receives the alarm signal, the operation controller 3 closes the plating-solution supply valve V1 and then opens the bypass valve V4. As described above, the operation controller 3 may gradually close the plating-solution supply valve V1. When the plating-solution supply valve V1 is closed, the supply of the plating solution to the plating tank 25 is stopped.

The plating-solution discharge valve V2 is fully open. The plating solution in the plating cell 31 flows through the bypass line 87 into the plating-solution discharge line 76a. Consequently, the plating solution in the plating cell 31 and the overflow tank 32 is delivered (or discharged) through the plating-solution discharge line 76a to the plating-solution reservoir 70 (step 2). After the liquid level sensor (not shown in the drawing) has detected that the level of the plating solution in the plating cell 31 has dropped to a low level, the operation controller 3 closes the plating-solution discharge valve V2 and the bypass valve V4 and then opens the rinsing-liquid supply valve V7. The rinsing liquid is supplied through the rinsing-liquid supply line 93 into the plating cell 31, so that the substrate is rinsed by the rinsing liquid (step 3).

The substrate is rinsed in the plating cell 31 of the plating tank 25 in the same manner as the substrate is rinsed in the second rinsing tank 28. More specifically, the rinsing-liquid supply valve V7 is opened to supply the rinsing liquid to the plating cell 31 until the plating cell 31 is filled with the rinsing liquid. The substrate held by the substrate holder 11 is rinsed with the rinsing liquid. Thereafter, the drain valve V5 is opened to drain the rinsing liquid from the plating cell 31 (and the overflow tank 32). Such supply and drain of the rinsing liquid are repeated a plurality of times.

After the rinsing of the substrate has been terminated, the rinsing-liquid supply valve V7 is opened so that the rinsing liquid is supplied to the plating cell 31 again. After the plating cell 31 is filled with the rinsing liquid, the rinsing-liquid supply valve V7 is closed. The substrate is kept immersed in the rinsing liquid (step 4). The rinsing liquid to be used may be pure water, or more preferably deaerated pure water. According to the present embodiment, the rinsing liquid also functions as a preservative liquid.

Next, an example of process of replacing the preservative liquid in the plating tank 25 with the plating solution will be described below with reference to a flowchart shown in FIG. 9. After the substrate holder 11 has been taken out of the plating tank 25, the operation controller 3 opens the drain valve V5 to drain the preservative liquid from the plating cell 31 and the overflow tank 32 (step 1). After the liquid level sensor (not shown in the drawing) has detected that the level of the preservative liquid in the plating cell 31 has dropped to a low level, the operation controller 3 closes the drain valve V5, whereby draining of the preservative liquid is stopped (step 2).

Then, the operation controller 3 opens the flushing valve V6 to allow the supply of the flushing liquid into the plating cell 31 (step 3). As a result, the plating cell 31 is cleaned with the flushing liquid. The operation controller 3 may open both the drain valve V5 and the flushing valve V6 simultaneously, or may open the flushing valve V6 and then open the drain valve V5. The process of cleaning the plating cell 31 with the flushing liquid may be omitted.

The operation controller 3 opens the plating-solution supply valve V1 and the plating-solution discharge valve V2 to start supplying the plating solution from the plating-solution reservoir 70 to the plating cell 31 (step 4). If substrates are being plated in the other plating tanks 25, the operation controller 3 may gradually open the plating-solution supply valve V1 over a period of time ranging from 1 second to 60 seconds in order to prevent the decrease in the flow rate of the plating solution flowing into the other plating tanks 25.

After the liquid level sensor (not shown in the drawing) has detected that the level of the plating solution in the plating cell 31 has risen to a high level, the plating solution is started to circulate between the plating tank 25 and the plating-solution reservoir 70 (step 5). Further, the flow rate of the circulating plating solution is adjusted, and the components of the plating solution are adjusted (step 6).

According to the present embodiment, the plural preservative-liquid supply lines 85 are coupled to the plural plating tanks 25, respectively. With this arrangement, the plating solution can be replaced with the preservative liquid individually in the plating tanks 25. For example, in the event of the occurrence of a failure in any one of the plating tanks 25, the plating solution in that plating tank 25 can be replaced with the preservative liquid, and the other plating tanks 25 can continue plating of substrates therein.

Since the preservative-liquid supply lines 85 and the drain lines 89 are provided separately from the plating-solution supply lines 74a and the plating-solution discharge lines 76a, the preservative liquid is not mixed into the plating solution and hence does not dilute the plating solution. Moreover, since the overflow tanks 32 are provided in the respective plating tanks 25, the preservative liquid that has overflowed one of the plating cells 31 is not mixed into the plating solution in the other plating tanks 25.

When a failure has occurred in one of the transporter 40 and the post-processing tank (i.e., the second rinsing tank 28 or the blowing tank 29), all of the substrates cannot be taken out of the plating tanks 25. Therefore, the plating solution in all of the plating tanks 25 is replaced with the preservative liquid, so that the substrates in all of the plating tanks 25 are immersed in the preservative liquid. In this case, the substrates are plated in the plating tanks 25 individually until the plating times preset for the respective plating tanks 25 elapse. The plating solution in the plating tanks 25 is replaced with the preservative liquid in the order in which the plating times have elapsed. Typically, the plating times that are different according to types of substrates are set for the plating tanks 25, respectively. According to the present embodiment, since the plural preservative-liquid supply lines 85 are coupled to the plural plating tanks 25, respectively, the plating solution in the plating tanks 25 can be replaced with the preservative liquid at different timings.

Figure 10:
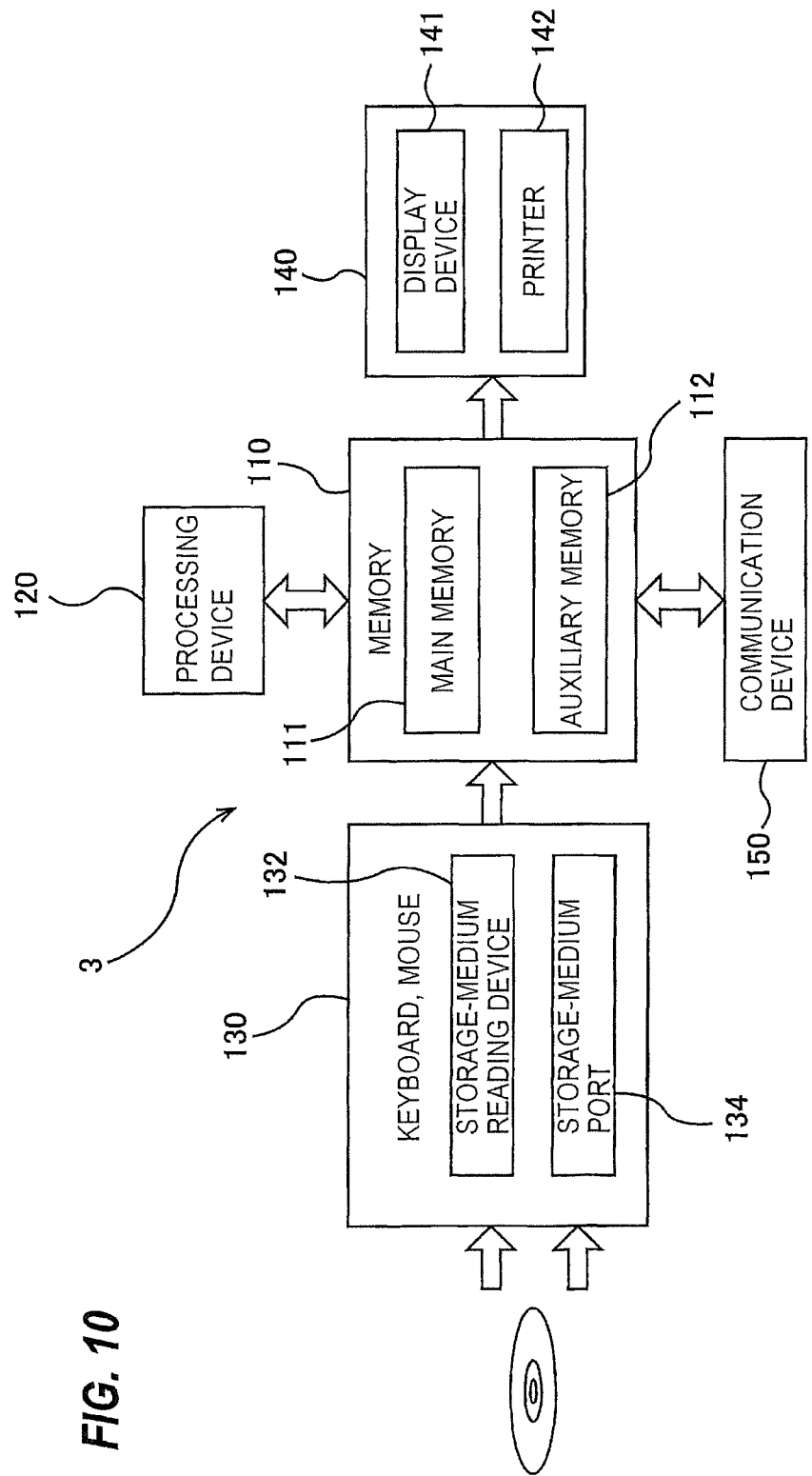
FIG. 10 is a schematic diagram showing an example of a construction of an operation controller.

The operations of the plating apparatus including the transporter 40 and the plating tanks 25 are controlled by the operation controller 3. In this embodiment, the operation controller 3 is constituted by a dedicated computer or a general-purpose computer. FIG. 10 is a schematic view showing an example of a structure of the operation controller 3. The operation controller 3 includes a memory 110 in which a program and data are stored, a processing device 120, such as CPU (central processing unit), for performing arithmetic operation according to the program stored in the memory 110, an input device 130 for inputting the data, the program, and various information into the memory 110, an output device 140 for outputting processing results and processed data, and a communication device 150 for connecting to a network, such as the Internet.

The memory 110 includes a main memory 111 which is accessible by the processing device 120, and an auxiliary memory 112 that stores the data and the program therein. The main memory 111 may be a random-access memory (RAM), and the auxiliary memory 112 is a storage device which may be a hard disk drive (HDD) or a solid-state drive (SSD).

The input device 130 includes a keyboard and a mouse, and further includes a storage-medium reading device 132 for reading the data from a storage medium, and a storage-medium port 134 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 132 include optical disk drive (e.g., CD drive, DVD drive) and card reader. Examples of the storage-medium port 134 include USB terminal. The program and/or the data stored in the storage medium is introduced into the operation controller 3 via the input device 130, and is stored in the auxiliary memory 112. The output device 140 includes a display device 141 and a printer 142. The printer 142 may be omitted.

The operation controller 3 operates according to the program electrically stored in the memory 110. Specifically, when the operation controller 3 receives an alarm signal from the failure detector 7, the operation controller 3 selectively operates the above-discussed valves V1 through V7 to carry out the steps of replacing the plating solution in the plating cell(s) with the preservative liquid (or the rinsing liquid). The program for causing the operation controller 3 to perform these steps is stored in a non-transitory tangible computer-readable storage medium. The operation controller 3 is provided with the program via the storage medium. The operation controller 3 may be provided with the program via communication network, such as the Internet.

Figure 11:
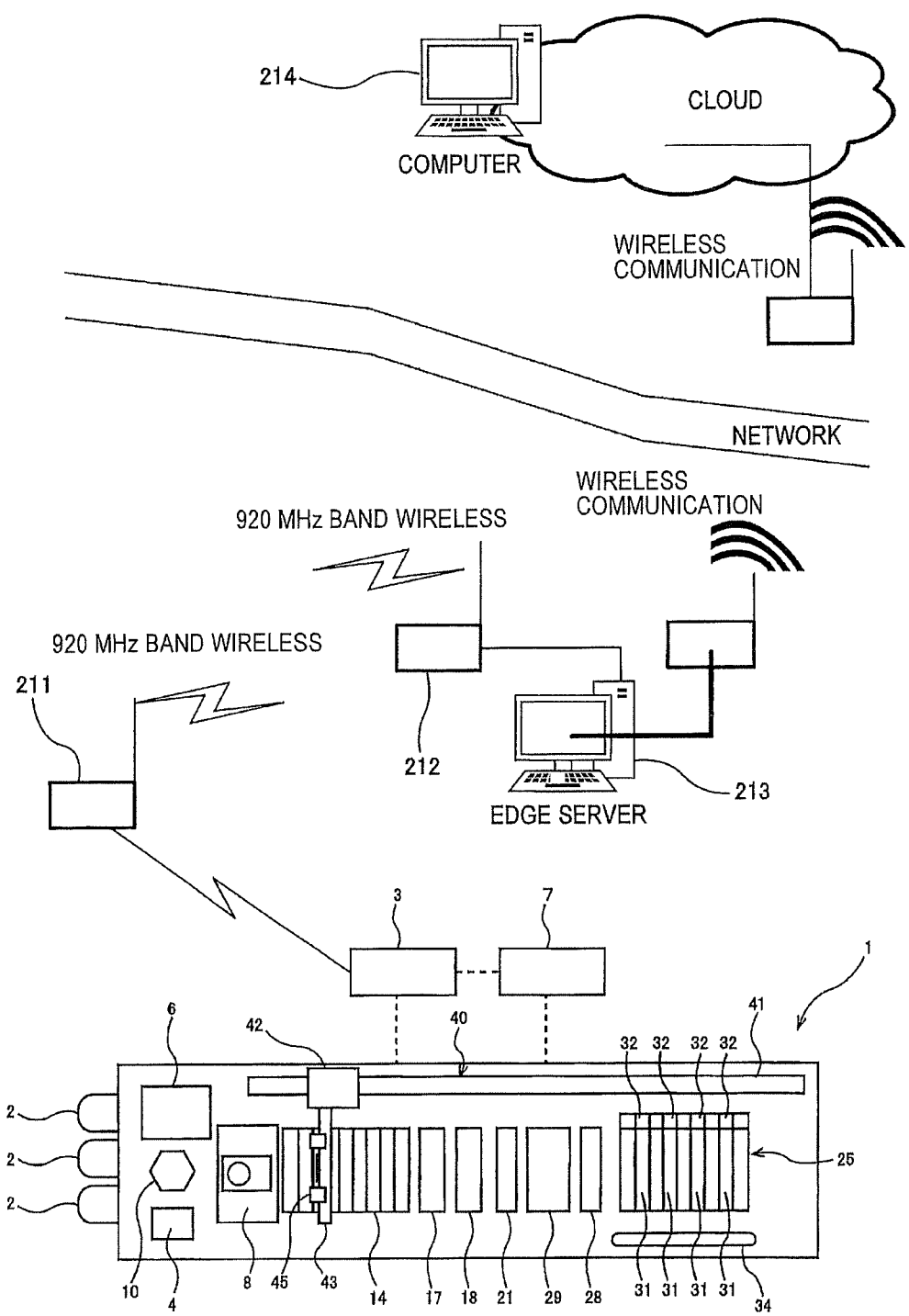
FIG. 11 is a plan view schematically showing an embodiment of the plating apparatus.

FIG. 11 is a plan view schematically showing an embodiment of the plating apparatus. The above-described signal, emitted by the transporter 40, the plating tank 25, the second rinsing tank 28, or the blowing tank 29 is sent to the failure detector 7, so that the failure detector 7 can detect a failure. The transporter 40, the plating tank 25, the second rinsing tank 28, or the blowing tank 29 transmits its own operation data (e.g., sensor measurement data, servomotor load data, etc.) to the operation controller 3 at predetermined time intervals or steadily. According to the present embodiment, a part of the operation controller 3 may comprise a programmable logic controller. The operation data are sent at predetermined time intervals or steadily from the operation controller 3 to a wireless module 211. The operation data are further transmitted from the wireless module 211 to a wireless module 212 by a wireless communication.

The wireless module 212 is connected to an edge server 213 that is constituted by a computer. This edge server 213 is disposed in the vicinity of the transporter 40, the plating tanks 25, the second rinsing tank 28, and the blowing tank 29. The edge server 213 extracts feature data from the above-described operation data that are generated by the transporter 40, the plating tank 25, the second rinsing tank 28, or the blowing tank 29, thereby convening the operation data into data that can be easily analyzed. The amount of the data is thus compressed. Thereafter, the extracted feature data are transmitted to a computer 214, which is connected to the network. The computer 214 is configured to perform machine leaning while accumulating the feature data therein, and predict a failure of the plating apparatus 1. The wireless modules 211, 212 are illustrated by way of example. The operation controller 3 and the edge server 213 may be interconnected by a wired communication, such as LAN. Similarly, the "wireless communication" shown in FIG. 11 may be a wire communication.

In the event that the computer 214 has predicted a failure of the plating apparatus 1, the computer 214 informs an operator. If the plating apparatus 1 is in a manual operation mode, the operator can choose to stop introducing new substrates into the plating apparatus 1 or to send to the operation controller 3 a control command for replacing the plating solution with the preservative liquid in each of the plating tanks 25 successively immediately after the substrates have been plated. Alternatively, if the plating apparatus 1 is in an automatic operation mode, the computer 214 sends a control command to the operation controller 3 for stopping introducing new substrates into the plating apparatus 1 and replacing the plating solution with the preservative liquid in each of the plating tanks 25 successively after the substrates have been plated. For replacing the plating solution with the preservative liquid in each of the plating tanks 25 successively after the substrates have been plated, the operation controller 3 sends command signals to the valves V1 through V7 for operating these valves V1 through V7.

According to the present embodiment, the computer 214 that is located at a distant place is able to predict a failure and emit a control signal to the operation controller 3 on the basis of the prediction result. The operator may refer to the operational state of the plating apparatus 1 that is monitored at all times and the information of a predicted failure of the plating apparatus 1 which has been derived from the computer 214, and may cause the computer 214 to emit a control command for shutting off a malfunctioning device without replacing the plating solution with the preservative liquid. For example, if the plating time is 1 hour and it is predicted that the maintenance of the transporter 40 will be completed in about 10 minutes, the operator may shut off the transporter 40 for maintenance without replacing the plating solution with the preservative liquid. Furthermore, the operator may cause the computer 214 to issue a control command for replacing the plating solution with the rinsing liquid instead of the preservative liquid to the operation controller 3. In the event of a communication disruption due to a failure of the wireless module or other cause, the operation controller 3 is capable of performing similar control processes.

The embodiments of the present invention that have been described previously are also applicable to an electroless plating apparatus and an electroless plating method.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A plating method comprising:
    transporting a plurality of substrates to a plurality of plating tanks, respectively, with a transporter;
    immersing the plurality of substrates in a plating solution held in the plurality of plating tanks to plate the plurality of substrates;
    detecting a failure that has occurred in any one of the plurality of plating tanks while the plurality of substrates are being plated; and
    replacing the plating solution in the plating tank, in which the failure has occurred, with a preservative liquid to thereby immerse a substrate in the preservative liquid, wherein replacing the plating solution comprises replacing the plating solution in the plating tank, in which the failure has occurred, with a preservative liquid to thereby immerse a substrate in the preservative liquid, while continuing plating substrates in other plating tanks.

2. The plating method according to claim 1, wherein the plating tank comprise a plating cell and an overflow tank, and
    the plating method further comprises, after replacing the plating solution with the preservative liquid, causing the preservative liquid to overflow the plating cell into the overflow tank.

3. The plating method according to claim 1, further comprising:
    delivering the plating solution in the plating tank to a plating-solution reservoir.

4. The plating method according to claim 3, further comprising:
    draining the preservative liquid from the plating tank; and
    supplying the plating solution from the plating-solution reservoir to the plating tank.

5. The plating method according to claim 1, wherein the preservative liquid comprises pure water or deaerated pure water.

6. The plating method according to claim 1, wherein replacing the plating solution in the plating tank with the preservative liquid comprises:
    discharging the plating solution from the plating tank in which the failure has occurred; and
    filling the plating tank with a preservative liquid to thereby immerse a substrate in the preservative liquid.

* * * * *